US009163935B2

(12) United States Patent
Den Boef et al.

(10) Patent No.: US 9,163,935 B2
(45) Date of Patent: Oct. 20, 2015

(54) DEVICE MANUFACTURING METHOD AND ASSOCIATED LITHOGRAPHIC APPARATUS, INSPECTION APPARATUS, AND LITHOGRAPHIC PROCESSING CELL

(71) Applicant: ASML Netherlands B.V., Veldhoven (NL)

(72) Inventors: Arie Jeffrey Den Boef, Waalre (NL); Kaustuve Bhattacharyya, Veldhoven (NL); Martin Jacobus Johan Jak, Eindhoven (NL); Michael Kubis, Düsseldorf (DE)

(73) Assignee: ASML Netherlands B.V., Veldhoven (NL)

( * ) Notice: Subject to any disclaimer, the term of this patent is extended or adjusted under 35 U.S.C. 154(b) by 238 days.

(21) Appl. No.: 13/687,569

(22) Filed: Nov. 28, 2012

(65) Prior Publication Data
US 2013/0148121 A1    Jun. 13, 2013

Related U.S. Application Data

(60) Provisional application No. 61/569,477, filed on Dec. 12, 2011.

(51) Int. Cl.
  *G01B 11/24* (2006.01)
  *G01B 11/14* (2006.01)
  *G03F 7/20* (2006.01)
  *G03F 9/00* (2006.01)

(52) U.S. Cl.
  CPC ............... *G01B 11/24* (2013.01); *G01B 11/14* (2013.01); *G03F 7/70633* (2013.01); *G03F 9/7003* (2013.01); *G03F 9/7049* (2013.01); *G03F 9/7088* (2013.01); *G03F 9/7092* (2013.01)

(58) Field of Classification Search
  None
  See application file for complete search history.

(56) References Cited

U.S. PATENT DOCUMENTS

| 6,600,561 B2 | 7/2003 | Tabei |
| 6,762,111 B2 | 7/2004 | Fukuda |
| 6,937,344 B2 * | 8/2005 | Monshouwer et al. ....... 356/508 |

(Continued)

FOREIGN PATENT DOCUMENTS

| EP | 1 628 164 A2 | 2/2006 |
| KR | 10-2008-0050013 A | 6/2008 |

OTHER PUBLICATIONS

English-Language Abstract for Korean Patent Publication No. 10-2008-0050013 A, published Jun. 5, 2008; 1 page.

(Continued)

*Primary Examiner* — Gordon J Stock, Jr.
(74) *Attorney, Agent, or Firm* — Sterne, Kessler, Goldstein & Fox P.L.L.C

(57) ABSTRACT

Disclosed is a device manufacturing method, and accompanying inspection and lithographic apparatuses. The method comprises measuring on the substrate a property such as asymmetry of a first overlay marker and measuring on the substrate a property such as asymmetry of an alignment marker. In both cases the asymmetry is determined. The position of the alignment marker on the substrate is then determined using an alignment system and the asymmetry information of the alignment marker and the substrate aligned using this measured position. A second overlay marker is then printed on the substrate; and a lateral overlay measured on the substrate of the second overlay marker with respect to the first overlay marker using the determined asymmetry information of the first overlay marker.

20 Claims, 8 Drawing Sheets

(56) References Cited

U.S. PATENT DOCUMENTS

Figure 1:
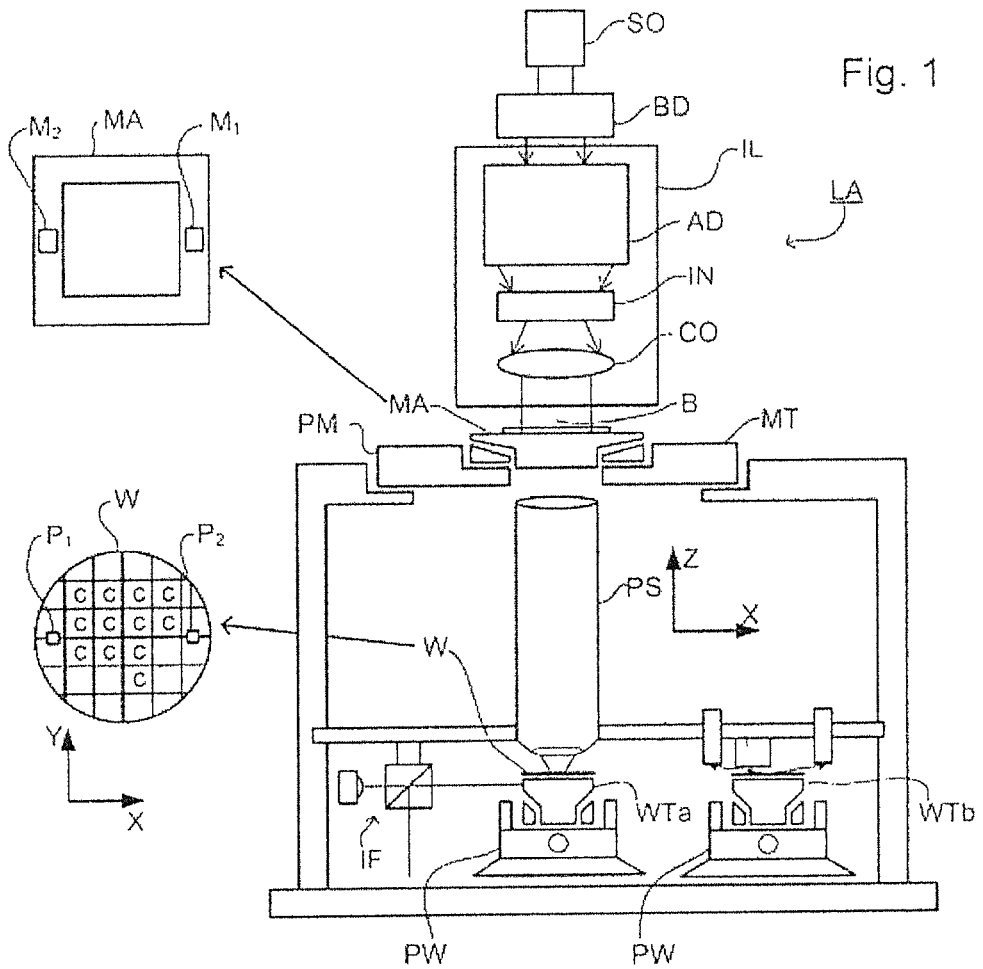

| | | |
|---|---|---|
| 7,415,319 B2 | 8/2008 | Werkman et al. |
| 2003/0098977 A1* | 5/2003 | Kim .............................. 356/401 |
| 2003/0223630 A1* | 12/2003 | Adel et al. .................... 382/145 |
| 2004/0059540 A1 | 3/2004 | Matsumoto et al. |
| 2004/0198018 A1* | 10/2004 | Fukuda ......................... 438/401 |
| 2005/0036144 A1 | 2/2005 | Suzuki |
| 2005/0096779 A1* | 5/2005 | Markoya ....................... 700/192 |
| 2009/0207399 A1* | 8/2009 | Fong et al. ..................... 355/72 |
| 2010/0321654 A1 | 12/2010 | Den Boef |
| 2012/0013881 A1 | 1/2012 | Den Boef et al. |

OTHER PUBLICATIONS

Dasari, P., et al., "A comparison of advanced overlay technologies," Proceedings of SPIE, Metrology, Inspection, and Process Control for Microlithography XXIV, vol. 7638, Apr. 2010; pp. 76381P-1 to 76381P-9.

International Search Report directed to related International Patent Application No. PCT/EP2012/074163, mailed Jul. 4, 2013; 3 pages.

* cited by examiner

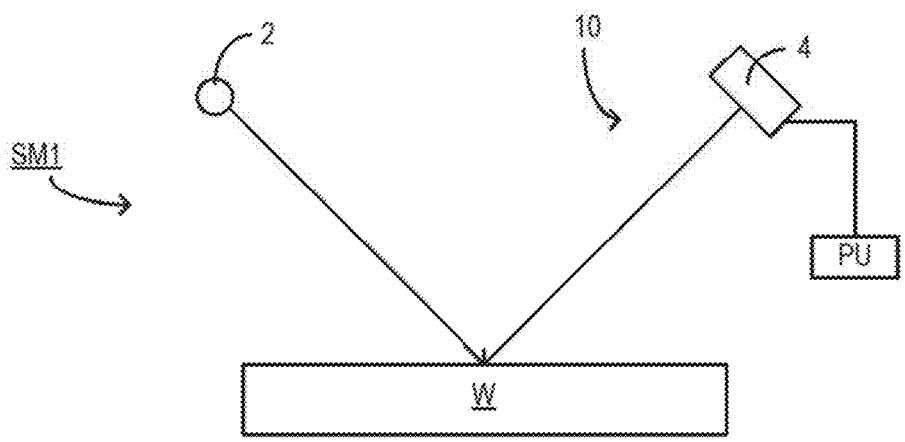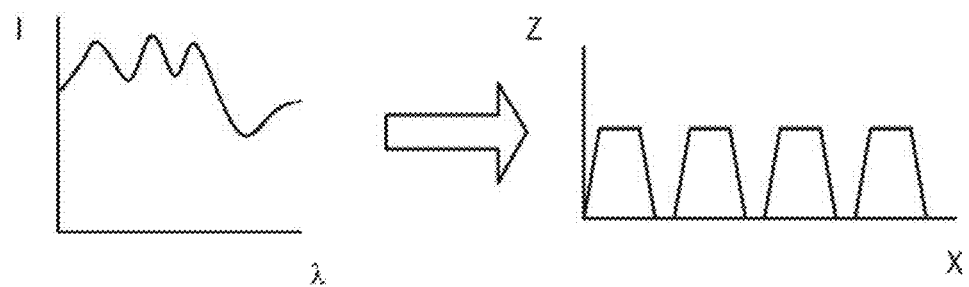
Fig. 3

DEVICE MANUFACTURING METHOD AND ASSOCIATED LITHOGRAPHIC APPARATUS, INSPECTION APPARATUS, AND LITHOGRAPHIC PROCESSING CELL

FIELD

The present invention relates to methods of inspection usable, for example, in the manufacture of devices by lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Devices are built up layer by layer and overlay is a measure of a lithographic apparatus' ability to print these layers accurately on top of each other. Successive layers or multiple processes on the same layer must be accurately aligned to the previous layer, otherwise electrical contact between structures will be poor and the resulting devices will not perform to specification. Overlay is a measure of the accuracy of this alignment. Good overlay improves device yield and enables smaller product patterns to be printed. The overlay error between successive layers formed in or on the patterned substrate is controlled by various parts of the exposure apparatus (of the lithographic apparatus). It is mostly the alignment system of the lithographic apparatus that is responsible for the alignment of the radiation onto the correct portions of the substrate. The alignment system uses one or more alignment gratings (or other structures) on the wafer in order to perform this alignment.

Overlay may be measured using an "image-based" (box-in-box) technique or Diffraction-Based Overlay (DBO) metrology. DBO is an emerging metrology technique used because of its superb TMU (Total Measurement Uncertainty) compared to "image-based" techniques. In the "image-based" case, overlay may be derived from a measurement of the position of a resist marker pattern relative to a marker pattern in an earlier formed product layer. In the DBO case, overlay is indirectly measured, for example by detecting variations in diffracted intensities of two overlapping periodic structures such as a top resist grating stacked over a product layer grating.

However, a problem is that the alignment grating and the overlay grating in the product layer can become asymmetric due to processing effects. The alignment grating asymmetry produces a significant alignment measurement error, resulting in increased overlay error. Similarly, the overlay grating asymmetry (which is not directly measurable with known DBO techniques) introduces an overlay measurement error that can also be quite significant (nm's). It is important to note that this error does not show up in TMU measurements: one can have excellent TMU (much less than 1 nm) and still have large overlay errors due to grating asymmetry. In the "image-based" case, the asymmetry of the product layer pattern may also introduce an overlay measurement error.

In addition to the above, it can also be shown that that alignment gratings and overlay gratings deform differently, which therefore result in different errors in, respectively, alignment and overlay metrology.

SUMMARY

It is desirable to provide a system which addresses the issue of asymmetry or similar imperfections in overlay and alignment gratings.

According to an aspect of the present invention, there is provided a device manufacturing method, comprising: measuring on a substrate a property of a first overlay marker that depends on a transverse profile of the first overlay marker, measuring on the substrate a property of an alignment marker that depends on a transverse profile of the alignment marker, determining, from the measured property of the first overlay marker, information relating to the transverse profile of the first overlay marker, determining, from the measured property of the alignment marker, information relating to the transverse profile of the alignment marker, measuring the position of the alignment marker on the substrate using an alignment system and the determined information relating to the transverse profile of the alignment marker, aligning the substrate using the measured position of the alignment marker, printing a second overlay marker on the substrate, and measuring a lateral overlay on the substrate of the second overlay marker with respect to the first overlay marker using the determined information relating to the transverse profile of the first overlay marker.

According to a second aspect of the present invention, there is provided an inspection apparatus for measuring lateral overlay on a substrate of a first overlay marker and a second overlay marker, the inspection apparatus comprising: a first projection system configured to project a radiation beam separately onto the first overlay marker and onto an alignment marker, a first detector configured to detect radiation having interacted with the first overlay marker and to detect radiation having interacted with the alignment marker, a first processor configured to determine a property of the first marker that depends on a transverse profile of the first marker, and to determine a property of the alignment marker that depends on a transverse profile of the alignment marker, a second projection system configured to project a radiation beam onto the overlaid first and second overlay markers, a second detector configured to detect radiation having interacted with the overlaid first and second overlay markers, a second processor configured to determine the lateral overlay using the detected radiation from the overlaid first and second overlay markers, wherein the inspection apparatus is configured to measure a lateral overlay on the substrate of the second overlay marker with respect to the first overlay marker using the determined information relating to the transverse profile of the first overlay marker.

According to a third aspect of the present invention, there is provided a lithographic apparatus comprising the inspection apparatus of the second aspect and further comprising an alignment system that comprises: an alignment projection system configured to project an alignment radiation beam onto the alignment marker, an alignment detector configured to detect alignment radiation having interacted with the alignment marker, and an alignment processor configured to control alignment of the alignment marker on the substrate, the alignment processor using information from the detected alignment radiation and the determined information relating to the transverse profile of the alignment marker.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

Figure 2:
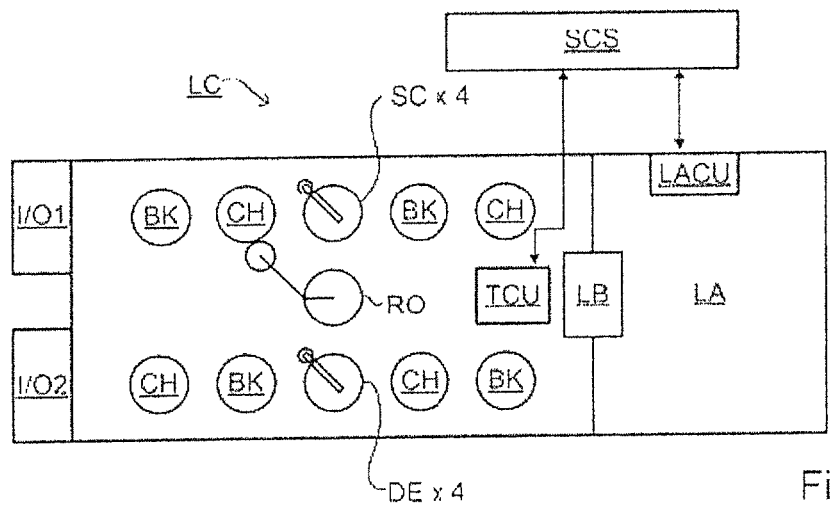
Figure 4:
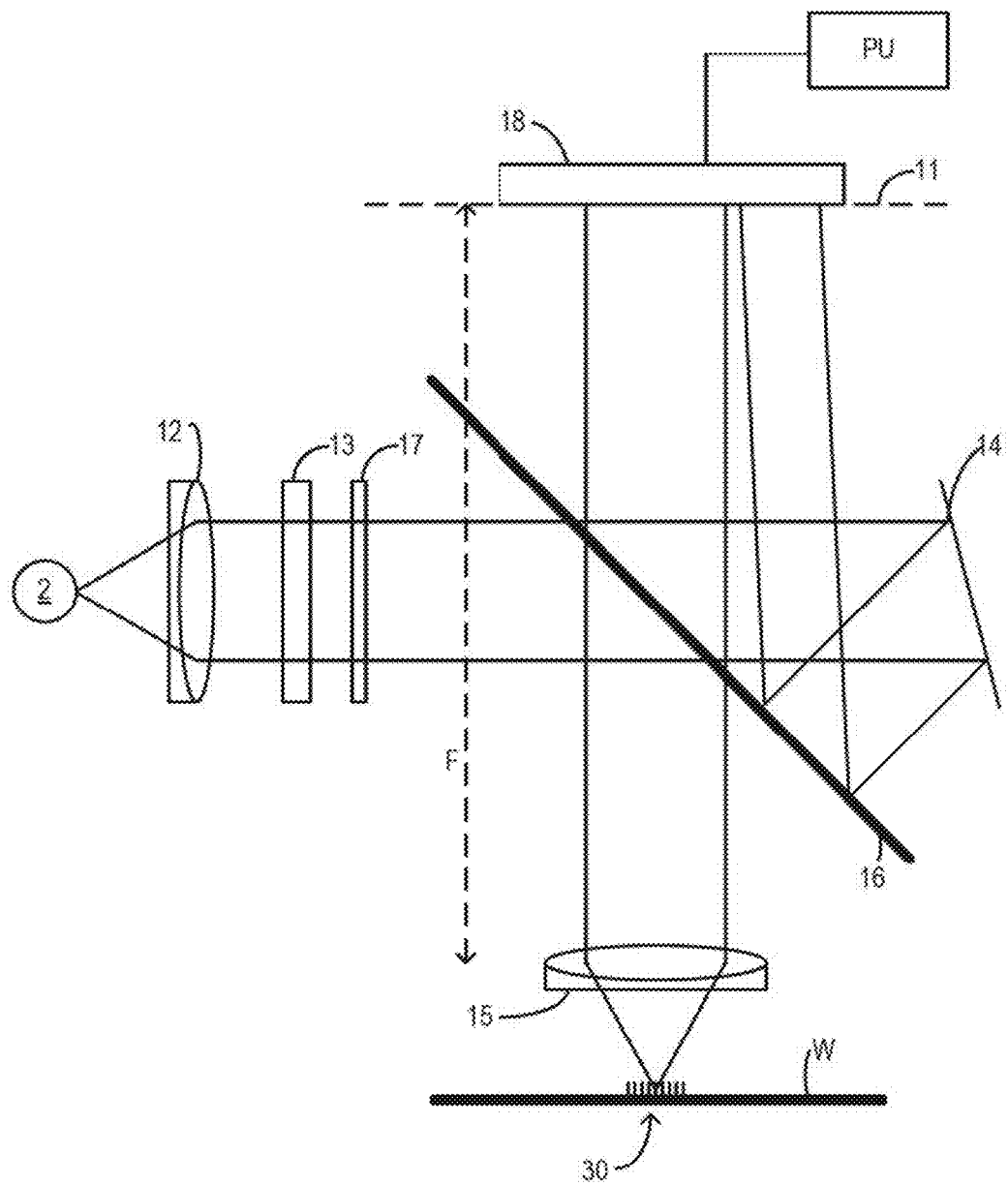
Figure 5:
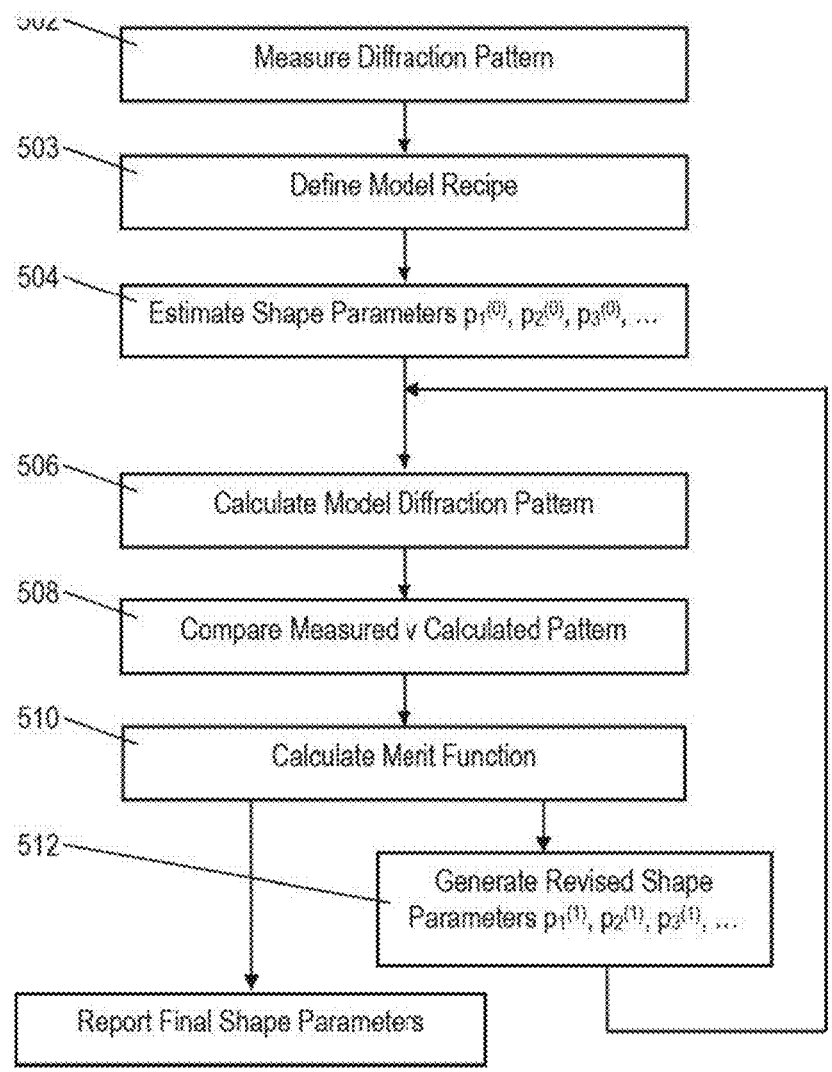
Figure 6:
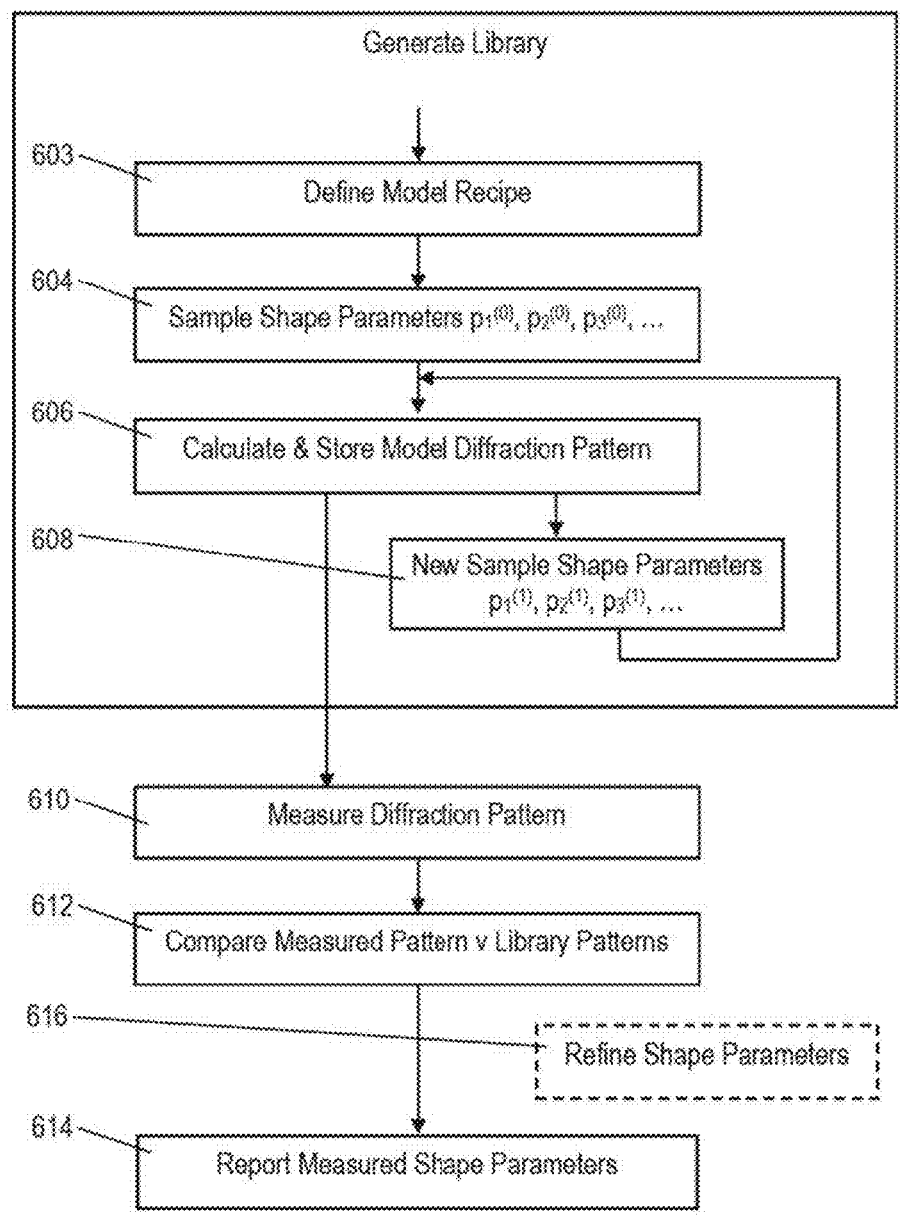
Figure 7:
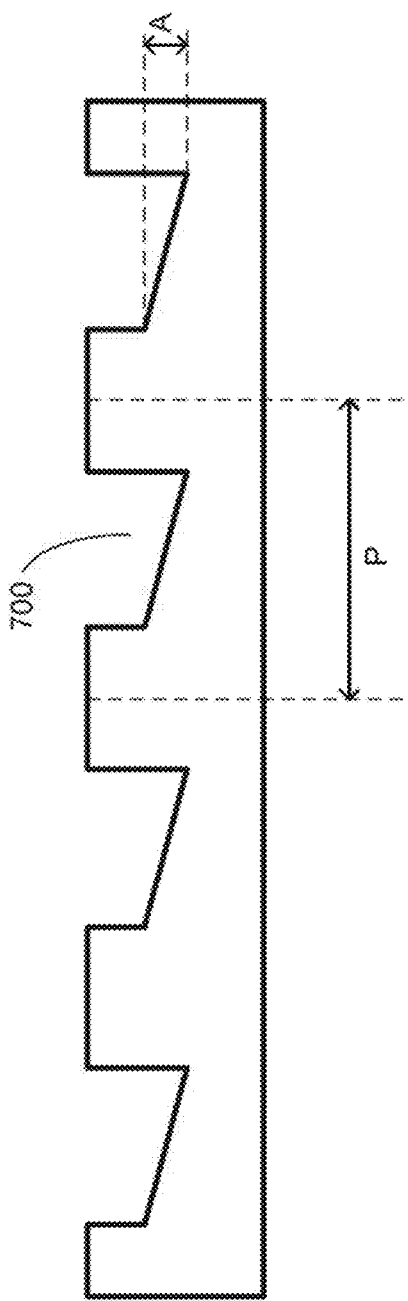
Figure 8:
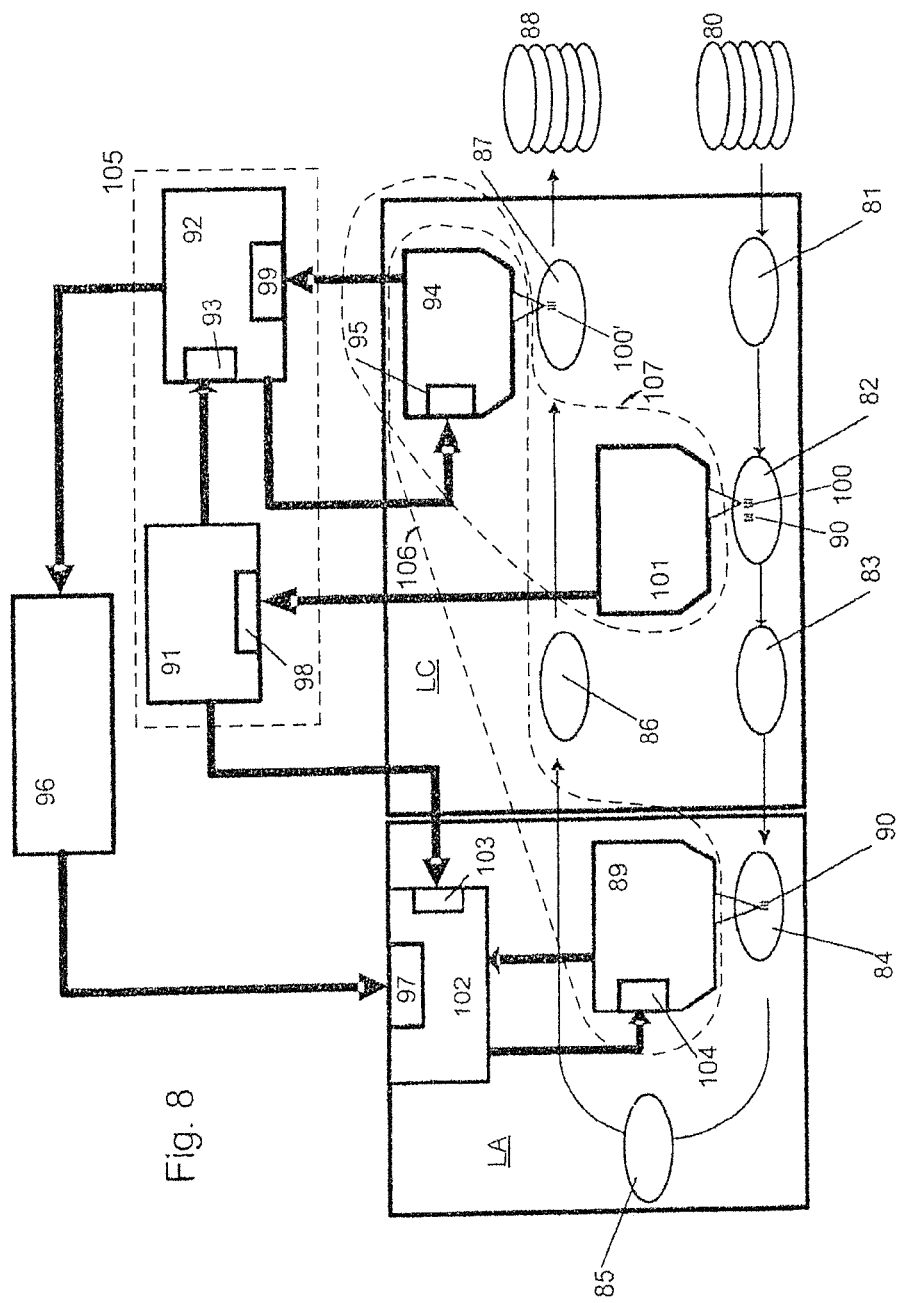
Figure 9:
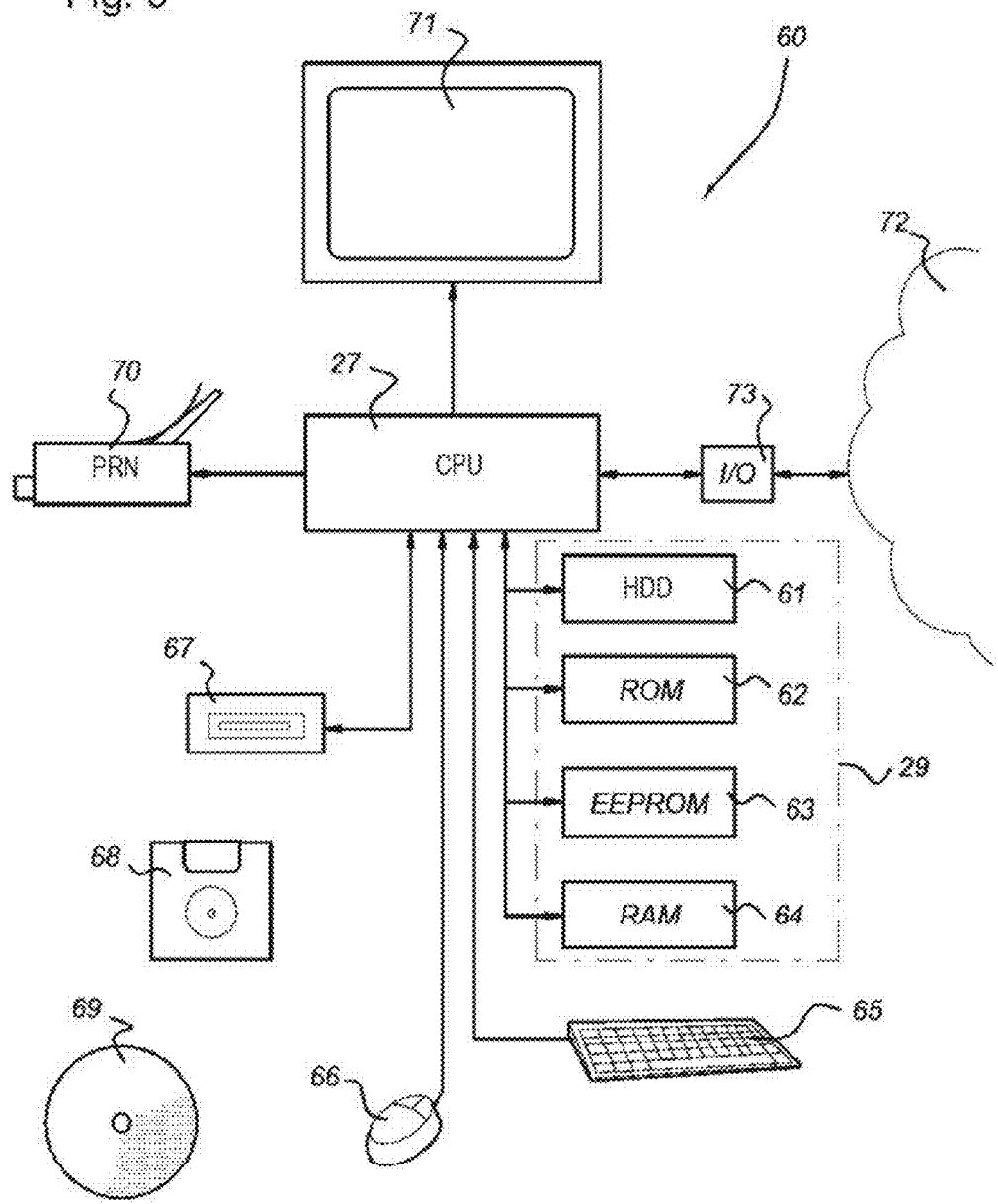

FIG. 1 depicts a lithographic apparatus.
FIG. 2 depicts a lithographic cell or cluster.
FIG. 3 depicts a first scatterometer.
FIG. 4 depicts a second scatterometer.
FIG. 5 depicts a first example process for reconstruction of a structure from scatterometer measurements.
FIG. 6 depicts a second example process for reconstruction of a structure from scatterometer measurements.
FIG. 7 shows in profile an etched grating exhibiting asymmetry.
FIG. 8 shows schematically, a system according to an embodiment of the present invention.
FIG. 9 depicts a computer assembly that may be used in apparatus according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically shows a lithographic apparatus LAP including a source collector module SO according to an embodiment of the present invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; substrate tables (e.g., wafer tables) WTa and WTb constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

FIG. 3 depicts a scatterometer SM1 which may be used in the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Another scatterometer that may be used with the present invention is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflecting surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$ and a spacing of at least 2 $\Delta\lambda$ (i.e., twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP 1,628,164A.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

As described above, the target is on the surface of the substrate. This target will often take the shape of a series of lines in a grating or substantially rectangular structures in a 2-D array. The purpose of rigorous optical diffraction theories in metrology is effectively the calculation of a diffraction spectrum that is reflected from the target. In other words, target shape information is obtained for CD (critical dimension) uniformity and overlay metrology. Overlay metrology is a measuring system in which the overlay of two targets is measured in order to determine whether two layers on a substrate are aligned or not. CD uniformity is simply a measurement of the uniformity of the grating on the spectrum to determine how the exposure system of the lithographic apparatus is functioning. Specifically, CD, or critical dimension, is the width of the object that is "written" on the substrate and is the limit at which a lithographic apparatus is physically able to write on a substrate.

Using one of the scatterometers described above in combination with modeling of a target structure such as the target 30 and its diffraction properties, measurement of the shape and other parameters of the structure can be performed in a number of ways. In a first type of process, represented by FIG. 5, a diffraction pattern based on a first estimate of the target shape (a first candidate structure) is calculated and compared with the observed diffraction pattern. Parameters of the model are then varied systematically and the diffraction re-calculated in a series of iterations, to generate new candidate structures and so arrive at a best fit. In a second type of process, represented by FIG. 6, diffraction spectra for many different candidate structures are calculated in advance to create a 'library' of diffraction spectra. Then the diffraction pattern observed from the measurement target is compared with the library of calculated spectra to find a best fit. Both methods can be used together: a coarse fit can be obtained from a library, followed by an iterative process to find a best fit.

Referring to FIG. 5 in more detail, the way the measurement of the target shape and/or material properties is carried out will be described in summary. The target will be assumed for this description to be periodic in only 1 direction (1-D structure). In practice it may be periodic in 2 directions (2-dimensional structure), and the processing will be adapted accordingly.

In step 502: The diffraction pattern of the actual target on the substrate is measured using a scatterometer such as those described above. This measured diffraction pattern is forwarded to a calculation system such as a computer. The calculation system may be the processing unit PU referred to above, or it may be a separate apparatus.

In step 503: A 'model recipe' is established which defines a parameterized model of the target structure in terms of a number of parameters pi (p1, p2, p3 and so on). These parameters may represent for example, in a 1D periodic structure, the angle of a side wall, the height or depth of a feature, the width of the feature. Properties of the target material and underlying layers are also represented by parameters such as refractive index (at a particular wavelength present in the scatterometry radiation beam). Specific examples will be given below. Importantly, while a target structure may be defined by dozens of parameters describing its shape and material properties, the model recipe will define many of these to have fixed values, while others are to be variable or 'floating' parameters for the purpose of the following process steps. Further below we describe the process by which the choice between fixed and floating parameters is made. Moreover, ways will be introduced in which parameters can be permitted to vary without being fully independent floating parameters. For the purposes of describing FIG. 5, only the variable parameters are considered as parameters pi.

In step 504: A model target shape is estimated by setting initial values pi(0) for the floating parameters (i.e., p1(0), p2(0), p3(0) and so on). Each floating parameter will be generated within certain predetermined ranges, as defined in the recipe.

In step 506: The parameters representing the estimated shape, together with the optical properties of the different elements of the model, are used to calculate the scattering properties, for example using a rigorous optical diffraction method such as RCWA or any other solver of Maxwell equations. This gives an estimated or model diffraction pattern of the estimated target shape.

In step 508, 510: The measured diffraction pattern and the model diffraction pattern are then compared and their similarities and differences are used to calculate a "merit function" for the model target shape.

In step 512: Assuming that the merit function indicates that the model needs to be improved before it represents accurately the actual target shape, new parameters p1(1), p2(1), p3(1), etc. are estimated and fed back iteratively into step 506. Steps 506-512 are repeated.

In order to assist the search, the calculations in step 506 may further generate partial derivatives of the merit function, indicating the sensitivity with which increasing or decreasing a parameter will increase or decrease the merit function, in this particular region in the parameter space. The calculation of merit functions and the use of derivatives is generally known in the art, and will not be described here in detail.

In step 514: When the merit function indicates that this iterative process has converged on a solution with a desired accuracy, the currently estimated parameters are reported as the measurement of the actual target structure.

The computation time of this iterative process is largely determined by the forward diffraction model used, i.e., the calculation of the estimated model diffraction pattern using a rigorous optical diffraction theory from the estimated target structure. If more parameters are required, then there are more degrees of freedom. The calculation time increases in principle with the power of the number of degrees of freedom. The estimated or model diffraction pattern calculated at 506 can be expressed in various forms. Comparisons are simplified if the calculated pattern is expressed in the same form as the measured pattern generated in step 502 For example, a modeled spectrum can be compared easily with a spectrum measured by the apparatus of FIG. 3; a modeled pupil pattern can be compared easily with a pupil pattern measured by the apparatus of FIG. 4.

Throughout this description from FIG. 5 onward, the term 'diffraction pattern' will be used, on the assumption that the scatterometer of FIG. 4 is used. The skilled person can readily adapt the teaching to different types of scatterometer, or even other types of measurement instrument.

FIG. 6 illustrates an alternative example process in which plurality of model diffraction patterns for different estimated target shapes (candidate structures) are calculated in advance and stored in a library for comparison with a real measurement. The underlying principles and terminology are the same as for the process of FIG. 5. The steps of the FIG. 6 process are:

In step 602: The process of generating the library begins. A separate library may be generated for each type of target structure. The library may be generated by a user of the measurement apparatus according to need, or may be pre-generated by a supplier of the apparatus.

In step 603: A 'model recipe' is established which defines a parameterized model of the target structure in terms of a number of parameters pi (p1, p2, p3 and so on). Considerations are similar to those in step 503 of the iterative process.

In step 604: A first set of parameters p1(0), p2(0), p3(0), etc. is generated, for example by generating random values of all the parameters, each within its expected range of values.

In step 606: A model diffraction pattern is calculated and stored in a library, representing the diffraction pattern expected from a target shape represented by the parameters.

In step 608: A new set of shape parameters p1(1), p2(1), p3(1), etc. is generated. Steps 606-608 are repeated tens, hundreds or even thousands of times, until the library which comprises all the stored modeled diffraction patterns is judged sufficiently complete. Each stored pattern represents a sample point in the multi-dimensional parameter space. The samples in the library should populate the sample space with a sufficient density that any real diffraction pattern will be sufficiently closely represented.

In step 610: After the library is generated (though it could be before), the real target 30 is placed in the scatterometer and its diffraction pattern is measured.

In step 612: The measured pattern is compared with the modeled patterns stored in the library to find the best matching pattern. The comparison may be made with every sample in the library, or a more systematic searching strategy may be employed, to reduce computational burden.

In step 614: If a match is found then the estimated target shape used to generate the matching library pattern can be determined to be the approximate object structure. The shape parameters corresponding to the matching sample are output as the measured shape parameters. The matching process may be performed directly on the model diffraction signals, or it may be performed on substitute models which are optimized for fast evaluation.

In step 616: Optionally, the nearest matching sample is used as a starting point, and a refinement process is used to obtain the final parameters for reporting. This refinement process may comprise an iterative process very similar to that shown in FIG. 5, for example.

Whether refining step 616 is needed or not is a matter of choice for the implementer. If the library is very densely sampled, then iterative refinement may not be needed because a good match will always be found. On the other hand, such a library might be too large for practical use. A practical solution is thus to use a library search for a coarse set of parameters, followed by one or more iterations using the merit function to determine a more accurate set of parameters to report the parameters of the target substrate with a desired accuracy. Where additional iterations are performed, it would be an option to add the calculated diffraction patterns and associated refined parameter sets as new entries in the library. In this way, a library can be used initially which is based on a relatively small amount of computational effort, but which builds into a larger library using the computational effort of the refining step 616. Whichever scheme is used, a further refinement of the value of one or more of the reported variable parameters can also be obtained based upon the goodness of the matches of multiple candidate structures. For example, the parameter values finally reported may be produced by interpolating between parameter values of two or more candidate structures, assuming both or all of those candidate structures have a high matching score.

The computation time of this iterative process is largely determined by the forward diffraction model at steps 506 and 606, i.e., the calculation of the estimated model diffraction pattern using a rigorous optical diffraction theory from the estimated target shape.

In lithography a new patterned layer needs to be printed on top of underlying product layers. The lateral alignment between these layers (overlay) is a critical factor. Alignment of a new layer is achieved by using an alignment sensor which measures the location of "alignment gratings" that are present on the product layers.

After this patterning step, the actual overlay is verified with an overlay measurement. In one embodiment, overlay measurement is made on a structure, such as an "overlay grating" having a first marker and second marker. A property of the first marker, such as position variations for various wavelengths, is measured by scatterometry. The property is one that depends on a transverse profile of the first marker. The transverse profile may have an asymmetry or a shape that affects the measured property. Information relating to the transverse profile of the first marker, such as asymmetry information, is determined from the measured property (this may be done by reconstruction of the grating). After printing of the second marker, the overlay measurement is performed using the determined information. This has the effect of correcting the measured overlay for the effect of the transverse profile of the first marker. For example, overlay error is corrected for the effect of first marker asymmetry.

Similarly, alignment gratings may also exhibit an asymmetry or similar defect. In an embodiment, property of the alignment grating, such as position variations for various wavelengths, is measured by scatterometry. As with the overlay grating, the property is one that depends on a transverse profile of the alignment grating. Information relating to the transverse profile of the alignment grating, such as asymmetry information, is determined from the measured property (this may be done by reconstruction of the grating). This information can be used when performing an alignment measurement, by correcting for the effect of alignment grating asymmetry.

FIG. 7 shows a grating structure having pitch P. It comprises a plurality of parallel etched channels 700. The grating structure may be the first marker in an overlay grating or it may be an alignment grating. In this example, the grating exhibits bottom asymmetry A in the etched pattern. The bottom asymmetry A is resultant from a tilt in the channel floor and is the difference in the channel depth between the channel sides.

The alignment and overlay gratings often have different pitches of (for example) 2200 and 500 nm, respectively. As a result of them being processed differently, different asymmetries can occur in the two types of gratings, resulting in different alignment and metrology errors. Moreover, the alignment sensor and the overlay metrology sensor respond differently to the asymmetry. Accordingly, the inventors have determined that, to correct for both overlay and alignment errors, both the alignment and overlay gratings should be reconstructed. In one embodiment, this is performed on the wafer by scatterometry, before the wafer is aligned and exposed with a new layer.

With reference to FIG. 8, the exposure or lithographic apparatus LA and lithographic cell LC process a batch of input wafers 80 through various steps 82 to 87 to a set of output wafers 88. A wafer 81 is introduced into the track. Then, at step 82, a metrology tool or inspection apparatus such as a scatterometer 101 projects a beam of light onto the first marker 100 of the overlay grating 100', on the wafer. It detects the light that has interacted with the overlay grating by scattering. The scatterometer 101 also projects a beam of light onto the alignment grating 90 on the wafer and detects the light that has interacted with the alignment grating by scattering. While the overlay grating and alignment grating are referred to in the singular, it should be clear that multiple gratings of each type may be (and usually are) provided on a single wafer.

The asymmetry processor 91 determines the asymmetry of the first marker 100 of the overlay grating 100', and asymmetry of the alignment grating 90, from the properties of the scattered light obtained from scatterometer 101. The asymmetry information for the first marker 100 of the overlay grating 100' may be different to that of the alignment grating 90 and therefore should be separately determined. The asymmetry processor 91 feeds information forward regarding the alignment grating 90 asymmetry to the subsequent alignment measurement. It also feeds information forward regarding asymmetry of the first marker 100 of the overlay grating 100' to the subsequent overlay measurement.

The wafer is processed through spin coating step 83 before passing into the exposure apparatus LA. In the alignment step 84, the phase grating alignment sensor 89 projects a beam of light onto the alignment grating 90 on the wafer and detects the light scattered by the grating. The phase grating alignment sensor is a special kind of scatterometer in that it derives position information by measuring the phase difference between diffraction orders that are diffracted by the pattern on the substrate. In practice steps 82 and 83 can be interchanged.

Alignment information from the alignment sensor 89 is sent to an alignment calculation processor 102. The alignment grating asymmetry information is received at a receiving module 103 of the alignment calculation processor 102, from asymmetry processor 91. The information may comprise a model of the alignment grating profile constructed by the asymmetry processor 91. Alternatively, the alignment calculation processor 102 may itself construct a model of the first marker grating profile using the received information about the alignment grating asymmetry. In either case, the alignment calculation processor 92 constructs a model of the alignment grating profile. Use of the alignment grating asymmetry information minimizes the effect that the asymmetry has on the alignment measurement.

In one embodiment, the alignment sensor hardware 89 has an interface 104 that receives control signals from the alignment calculation processor 102. The instructions cause the alignment sensor 89 to adjust its measurement settings. The asymmetry information can thus be used by the alignment calculation processor 102 to configure the wavelength and/or polarisation of the beam of light so as to minimize the effect of the asymmetry on the alignment measurement. In addition, or alternatively, the information may be used to configure the detector in alignment sensor 89 for the same purpose.

Following alignment, the wafer is exposed 85 with a second marker on top of the first marker, along with a product pattern. The resist is then developed 86 to print the overlay marker 100' comprising the second marker stacked on top of the first marker 100.

As the above, the first marker asymmetry information is fed forward from asymmetry processor 91 to the overlay calculation processor 92. The overlay calculation processor 92 has a receiving module 93 that receives the information about the first marker grating asymmetry. The information may comprise a model of the first marker grating profile constructed by the asymmetry processor 91. Alternatively, the overlay calculation processor 92 may itself construct a model of the first marker grating profile using the received information about the first marker grating asymmetry. In either case, the overlay calculation processor 92 constructs a model of the stacked overlay grating profile using or incorporating a model of the first marker grating profile. The stack model is then used to determine the overlay offset and use of the first marker asymmetry information minimizes the effect of the asymmetry on the overlay offset measurement.

A second metrology tool or inspection apparatus such as a scatterometer 94 projects a beam of light onto the overlay grating 100' on the wafer. It detects the light that has interacted with the overlay gratings by scattering. In one embodiment, the scatterometer sensor hardware 94 has an interface 95 that receives control signals from the overlay calculation processor 92. The instructions cause the scatterometer sensor 94 to adjust its measurement settings. The asymmetry information is thus used by the calculation processor to configure the wavelength and/or polarisation of the beam of light so as to minimize the effect of the asymmetry on the overlay measurement. In addition, or alternatively, the information may be used to configure the detector in the scatterometer 94 for the same purpose.

The overlay calculation processor 92 determines the overlay from the properties of the scattered light detected in the scatterometer sensor hardware 92. The overlay offset data is fed to a controller 96 that feeds corrections back to the feedback receiving module 97 of the exposure apparatus LA for correction of errors in the overlay, for example by feeding corrections into the alignment system.

Thus the first marker gratings 100 and alignment gratings 90 on the wafer are measured before the resist is exposed at step 85.

In addition to the measured asymmetry data, the scatterometer 101 may also acquire other information that enables the identification of the type and amount of asymmetry that is present in the gratings 90, 100, such as (1) diffracted intensity and/or polarization state as a function of diffraction angle/order, including for multiple input polarizations; and (2) diffracted intensity and/or polarizations state as a function of wavelength, including for multiple polarizations of the illumination light.

This measured information is used to separately characterise the grating asymmetry in both the overlay and alignment gratings. In either case, this characterization may be a reconstruction of the grating profile using the same or similar techniques to those that are used in scatterometry, and as illustrated in FIGS. 5 and 6.

The overlay may be obtained from the light scattered from the composite grating stack of a resist grating (second marker) on top of a processed 102 grating (first marker) using the information that is obtained from the alignment sensor. This results in a more robust measurement of the overlay since the asymmetry that is introduced by the processed grating can be correctly taken into account.

The overlay calculation processor 92 may be incorporated in a metrology tool with the scatterometer 94. The alignment calculation processor 102 may be incorporated inside the lithographic apparatus, or may be separate to it. An alternative embodiment of the present invention is a lithographic apparatus or metrology tool with the asymmetry processor 91 incorporated in it. Separate asymmetry processors may be provided for determination of the overlay grating asymmetry and alignment grating asymmetry. Also, scatterometer 94 and scatterometer 101 may be the same physical tool 107. A further embodiment dispenses with scatterometer 101 and instead uses alignment sensor 89 in its place to inspect the first marker and the alignment grating, feeding this information to asyrrimetry processor 91. Thus, a single physical tool 106 performs the functions of the detector in the scatterometer 94 and the alignment sensor 89.

Another embodiment uses an overlay processor for use with conventional lithographic apparatus and metrology tools, having a module 98 to receive measurements of the first marker, for example from scatterometer 101, and a module 99 to receive overlay measurements of the first and the second marker, for example from scatterometer 94, and a processor 105 performing the functions of the asymmetry processor 91 and the overlay calculation processor 92. Similarly another embodiment uses an alignment processor for use with conventional lithographic apparatus, having a module 98 to receive measurements of the alignment grating, for example from scatterometer 101, and a module 97 to receive corrective data feedback from the overlay measurements, to correct for of errors in the overlay, and a processor performing the functions of the asymmetry processor 91 and the alignment calculation processor 102. In these embodiments, or any others disclosed herein, separate asymmetry processors may be provided for determination of the overlay grating asymmetry and alignment grating asymmetry.

Measuring asymmetry is not restricted to gratings but to other 1-dimensional periodic structures. Asymmetry measurement may also be applied to structures that are periodic in two dimensions such as contact holes.

It should be understood that the asymmetry processor 91, the overlay calculation processor 92, the alignment calculation processor 102 and the controller 96 may be implemented in one or more computer assembly 60 as shown in FIG. 9. The computer assembly 60 may be a dedicated computer in the form of an asymmetry processor 91 or an overlay calculation processor 92 in embodiments according to the present invention or, alternatively, be a central computer controlling the lithographic apparatus. The computer assembly 60 may be arranged for loading a computer program product comprising computer executable code. This may enable the computer assembly 60, when the computer program product is downloaded, to control aforementioned uses of lithographic and inspection apparatuses.

The memory 29 connected to processor 27 may comprise a number of memory components like a hard disk 61, Read Only Memory (ROM) 62, Electrically Erasable Programmable Read Only Memory (EEPROM) 63 or Random Access Memory (RAM) 64. Not all aforementioned memory components need to be present. Furthermore, it is not essential that aforementioned memory components are physically in close proximity to the processor 27 or to each other. They may be located at a distance away.

The processor 27 may also be connected to some kind of user interface, for instance a keyboard 65 or a mouse 66. A touch screen, track ball, speech converter or other interfaces that are known to persons skilled in the art may also be used.

The processor 27 may be connected to a reading unit 67, which is arranged to read data, e.g., in the form of computer executable code, from and under some circumstances store data on a data carrier, like a floppy disc 68 or a CDROM 69. Also DVD's or other data carriers known to persons skilled in the art may be used.

The processor 27 may also be connected to a printer 70 to print out output data on paper as well as to a display 71, for instance a monitor or LCD (Liquid Crystal Display), of any other type of display known to a person skilled in the art.

The processor 27 may be connected to a communications network 72, for instance a public switched telephone network (PSTN), a local area network (LAN), a wide area network (WAN) etc. by means of transmitters/receivers 73 responsible for input/output (I/O). The processor 27 may be arranged to communicate with other communication systems via the communications network 72. In an embodiment of the present invention external computers (not shown), for instance personal computers of operators, can log into the processor 27 via the communications network 72.

The processor 27 may be implemented as an independent system or as a number of processing units that operate in parallel, wherein each processing unit is arranged to execute sub-tasks of a larger program. The processing units may also be divided in one or more main processing units with several subprocessing units. Some processing units of the processor 27 may even be located a distance away of the other processing units and communicate via communications network 72.

Embodiments according to the invention are provided in below numbered clauses:

1. A device manufacturing method, comprising:
    measuring on a substrate a property of a first overlay marker that depends on a transverse profile of the first overlay marker;
    measuring on the substrate a property of an alignment marker that depends on a transverse profile of the alignment marker;

determining, from the measured property of the first overlay marker, information relating to the transverse profile of the first overlay marker;

determining, from the measured property of the alignment marker, information relating to the transverse profile of the alignment marker;

measuring the position of the alignment marker on the substrate using an alignment system and the determined information relating to the transverse profile of the alignment marker;

aligning the substrate using the measured position of the alignment marker;

printing a second overlay marker on the substrate; and measuring a lateral overlay on the substrate of the second overlay marker with respect to the first overlay marker using the determined information relating to the transverse profile of the first overlay marker.

2. The method of clause 1 wherein the measured lateral overlay is used in subsequent measurement of the position of the alignment marker on the substrate.

3. The method of clause 1 or clause 2 further comprising the step of transferring a pattern from a patterning device onto the substrate after the step of aligning the substrate using the measured position of the alignment marker.

4. A method according clause 1, 2 or 3 wherein the step of measuring the position of the alignment marker comprises configuring the alignment system to be responsive to the determined information relating to the transverse profile of the alignment marker.

5. A method according to any preceding clause, wherein the step of measuring the property of the first overlay marker and the step of measuring the property of the alignment marker comprises separately:

projecting a radiation beam onto the first overlay marker, detecting radiation from the first overlay marker and determining the property of the first overlay marker using the detected radiation from the first overlay marker; and projecting a radiation beam onto the alignment marker, detecting radiation from the alignment marker; and determining the property of the alignment marker using the detected radiation from the alignment marker.

6. A method according to any preceding clause, wherein
the step of determining information relating to the transverse profile of the first overlay marker comprises constructing a model of at least a portion of the first overlay marker; and the step of determining information relating to the transverse profile of the alignment marker comprises constructing a model of at least a portion of the alignment marker.

7. A method according to clause 6, wherein the step of measuring the lateral overlay comprises constructing a model of a portion of the substrate comprising at least a portion of the first and second overlay markers using the model of the at least a portion of the first overlay marker.

8. A method according to any previous clause, wherein the step of measuring the lateral overlay comprises:

projecting a second radiation beam onto the first and second overlay markers;

detecting second radiation having interacted with the first and second overlay markers; and determining the lateral overlay using the detected second radiation.

9. A method according clause 8, wherein the step of projecting the second radiation beam comprises configuring the second radiation beam responsive to the determined information relating to the transverse profile of the first overlay marker and/or configuring the detection of the second radiation beam responsive to the determined information relating to the transverse profile of the first overlay marker.

10. A method according to any previous clause, wherein the step of measuring the position of the alignment marker comprises configuring the alignment system to be responsive to the determined lateral overlay.

11. A method according to any previous clause, wherein the first overlay marker and the alignment marker comprise gratings and the property of each marker that depends on a transverse profile of the marker is dependent on a measure of asymmetry in each grating.

12. An inspection apparatus for measuring lateral overlay on a substrate of a first overlay marker and a second overlay marker, the inspection apparatus comprising:

a first projection system configured to project a radiation beam separately onto the first overlay marker and onto an alignment marker;

a first detector configured to detect radiation having interacted with the first overlay marker and to detect radiation having interacted with the alignment marker;

a first processor configured to determine a property of the first marker that depends on a transverse profile of the first marker, and to determine a property of the alignment marker that depends on a transverse profile of the alignment marker;

a second projection system configured to project a radiation beam onto the overlaid first and second overlay markers;

a second detector configured to detect radiation having interacted with the overlaid first and second overlay markers;

a second processor configured to determine the lateral overlay using the detected radiation from the overlaid first and second overlay markers;

wherein the inspection apparatus is configured to measure a lateral overlay on the substrate of the second overlay marker with respect to the first overlay marker using the determined information relating to the transverse profile of the first overlay marker.

13. An inspection apparatus according to clause 12 being operable to configure the second projection system responsive to the determined information relating to the transverse profile of the first overlay marker and/or to configure the second detector responsive to the determined information relating to the transverse profile of the first overlay marker.

14. An inspection apparatus according to clause 12 or 13 being operable to determine information relating to the transverse profile of the first overlay marker by constructing a model of at least a portion of the first overlay marker.

15. An inspection apparatus according to clause 14 being operable to construct a model of a portion of the substrate comprising at least a portion of the first and second overlay markers using the model of the at least a portion of the first overlay marker.

16. An inspection apparatus according to any of clauses 12 to 15 wherein the first and second processors are comprised as a single processor.

17. An inspection apparatus according to any of clauses 12 to 16 wherein the first and second projection systems are comprised as a single projection system, and the first and second detectors are comprised as a single detector.

18. A lithographic apparatus comprising the inspection apparatus of any of clauses 12 to 17 and further comprising an alignment system that comprises:

an alignment projection system configured to project an alignment radiation beam onto the alignment marker;

an alignment detector configured to detect alignment radiation having interacted with the alignment marker; and an alignment processor configured to control alignment of the alignment marker on the substrate, the alignment processor using information from the detected alignment radiation and the determined information relating to the transverse profile of the alignment marker.

19. A lithographic apparatus according to clause 18 comprising a lithographic projection system operable to print the second overlay marker on the substrate.

20. A lithographic apparatus according to clause 18 or 19 being operable such that the alignment processor uses the measured lateral overlay in the controlling alignment of the alignment marker on the substrate.

21. A lithographic apparatus according to any of clauses 18 to 20 operable such that the alignment system uses the determined information relating to the transverse profile of the alignment marker to configure the alignment projection system and/or alignment detector accordingly.

22. A lithographic apparatus according to any of clauses 18 to 21 wherein the first overlay marker and the alignment marker comprise gratings and the property of each marker that depends on a transverse profile of the marker is dependent on a measure of asymmetry in each grating.

23. A computer program product containing one or more sequences of machine-readable instructions, the instructions being adapted for controlling the measuring and determining steps of a method according to any of clauses 1 to 11.

24. A method of manufacturing a device comprising the method according to any of clauses 1 to 11, and further comprising printing product structures on the substrate using the lithographic apparatus, during the step of printing the second overlay marker on the substrate.

25. A device manufacturing method, comprising:
measuring on a substrate a property of a first overlay marker that depends on a transverse profile of the first overlay marker;
measuring on the substrate a property of an alignment marker that depends on a transverse profile of the alignment marker;
determining, from the measured property of the first overlay marker, information relating to the transverse profile of the first overlay marker;
determining, from the measured property of the alignment marker, information relating to the transverse profile of the alignment marker;
measuring the position of the alignment marker on the substrate using an alignment system and the determined information relating to the transverse profile of the alignment marker;
aligning the substrate using the measured position of the alignment marker;
printing a second overlay marker on the substrate; and
measuring a lateral overlay on the substrate of the second overlay marker with respect to the first overlay marker using the determined information relating to the transverse profile of the first overlay marker.

26. The method of clause 25, wherein the measured lateral overlay is used in subsequent measurement of the position of the alignment marker on the substrate.

27. The method of clause 25, further comprising transferring a pattern from a patterning device onto the substrate after the aligning the substrate using the measured position of the alignment marker.

28. The method of clause 25, wherein the measuring the position of the alignment marker comprises configuring the alignment system to be responsive to the determined information relating to the transverse profile of the alignment marker.

29. The method of clause 25, wherein the measuring the property of the first overlay marker and the measuring the property of the alignment marker comprises separately:
projecting a radiation beam onto the first overlay marker, detecting radiation from the first overlay marker and determining the property of the first overlay marker using the detected radiation from the first overlay marker; and
projecting a radiation beam onto the alignment marker, detecting radiation from the alignment marker; and determining the property of the alignment marker using the detected radiation from the alignment marker.

30. The method of clause 25, wherein
the determining information relating to the transverse profile of the first overlay marker comprises constructing a model of at least a portion of the first overlay marker; and
the determining information relating to the transverse profile of the alignment marker comprises constructing a model of at least a portion of the alignment marker.

31. The method according to clause 30, wherein the measuring the lateral overlay comprises constructing a model of a portion of the substrate comprising at least a portion of the first and second overlay markers using the model of the at least a portion of the first overlay marker.

32. The method of clause 25, wherein the measuring the lateral overlay comprises:
projecting a second radiation beam onto the first and second overlay markers;
detecting second radiation having interacted with the first and second overlay markers; and
determining the lateral overlay using the detected second radiation.

33. The method according clause 32, wherein the projecting the second radiation beam comprises configuring the second radiation beam responsive to the determined information relating to the transverse profile of the first overlay marker and/or configuring the detection of the second radiation beam responsive to the determined information relating to the transverse profile of the first overlay marker.

34. The method of clause 25, wherein the measuring the position of the alignment marker comprises configuring the alignment system to be responsive to the determined lateral overlay.

35. The method of clause 25, wherein the first overlay marker and the alignment marker comprise gratings and the property of each marker that depends on a transverse profile of the marker is dependent on a measure of asymmetry in each grating.

36. An inspection apparatus comprising:
a first projection system configured to project a radiation beam separately onto a first overlay marker and onto an alignment marker;
a first detector configured to detect radiation having interacted with the first overlay marker and to detect radiation having interacted with the alignment marker;
a first processor configured to determine a property of the first marker that depends on a transverse profile of the first marker, and to determine a property of the alignment marker that depends on a transverse profile of the alignment marker;

a second projection system configured to project a radiation beam onto the overlaid first and second overlay markers;
a second detector configured to detect radiation having interacted with the overlaid first and second overlay markers;
a second processor configured to determine the lateral overlay using the detected radiation from the overlaid first and second overlay markers;
wherein the inspection apparatus is configured to measure a lateral overlay on the substrate of the second overlay marker with respect to the first overlay marker using the determined information relating to the transverse profile of the first overlay marker.

37. The inspection apparatus of clause 36, wherein:
the second projection system is responsive to the determined information relating to the transverse profile of the first overlay marker; or
the second detector is responsive to the determined information relating to the transverse profile of the first overlay marker.

38. The inspection apparatus of clause 36, wherein information relating to the transverse profile of the first overlay marker is determined by constructing a model of at least a portion of the first overlay marker.

39. The inspection apparatus of clause 38, wherein a model of a portion of the substrate comprising at least a portion of the first and second overlay markers is constructed using the model of the at least a portion of the first overlay marker.

40. The inspection apparatus of clause 36, wherein the first and second processors are comprised as a single processor.

41. The inspection apparatus of clause 36, wherein the first and second projection systems are comprised as a single projection system, and the first and second detectors are comprised as a single detector.

42. The inspection apparatus of clause 36, further comprising an alignment system that comprises:
an alignment projection system configured to project an alignment radiation beam onto the alignment marker;
an alignment detector configured to detect alignment radiation having interacted with the alignment marker; and
an alignment processor configured to control alignment of the alignment marker on the substrate, the alignment processor using information from the detected alignment radiation and the determined information relating to the transverse profile of the alignment marker.

43. The inspection apparatus of clause 42, comprising a lithographic projection system operable to print the second overlay marker on the substrate.

44. The inspection apparatus of clause 42, wherein the alignment processor uses the measured lateral overlay in the controlling alignment of the alignment marker on the substrate.

45. The inspection apparatus of clause 42, wherein the alignment system uses the determined information relating to the transverse profile of the alignment marker to configure the alignment projection system and/or alignment detector accordingly.

46. The inspection apparatus of clause 42, wherein the first overlay marker and the alignment marker comprise gratings and the property of each marker that depends on a transverse profile of the marker is dependent on a measure of asymmetry in each grating.

47. A computer program product containing one or more sequences of machine-readable instructions, the instructions configure to perform an operation comprising:
measuring on a substrate a property of a first overlay marker that depends on a transverse profile of the first overlay marker;
measuring on the substrate a property of an alignment marker that depends on a transverse profile of the alignment marker;
determining, from the measured property of the first overlay marker, information relating to the transverse profile of the first overlay marker;
determining, from the measured property of the alignment marker, information relating to the transverse profile of the alignment marker;
measuring the position of the alignment marker on the substrate using an alignment system and the determined information relating to the transverse profile of the alignment marker;
aligning the substrate using the measured position of the alignment marker;
printing a second overlay marker on the substrate; and
measuring a lateral overlay on the substrate of the second overlay marker with respect to the first overlay marker using the determined information relating to the transverse profile of the first overlay marker.

48. A method of manufacturing a device comprising:
measuring on a substrate a property of a first overlay marker that depends on a transverse profile of the first overlay marker;
measuring on the substrate a property of an alignment marker that depends on a transverse profile of the alignment marker;
determining, from the measured property of the first overlay marker, information relating to the transverse profile of the first overlay marker;
determining, from the measured property of the alignment marker, information relating to the transverse profile of the alignment marker;
measuring the position of the alignment marker on the substrate using an alignment system and the determined information relating to the transverse profile of the alignment marker;
aligning the substrate using the measured position of the alignment marker; printing a second overlay marker on the substrate;
measuring a lateral overlay on the substrate of the second overlay marker with respect to the first overlay marker using the determined information relating to the transverse profile of the first overlay marker; and
printing product structures on the substrate using the lithographic apparatus, during the printing the second overlay marker on the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. For example, the present invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claim is:

1. A device manufacturing method, comprising:
   measuring on a substrate a property of a first overlay marker that depends on a transverse profile of the first overlay marker;
   measuring on the substrate a property of an alignment marker that depends on a transverse profile of the alignment marker;
   determining, from the measured property of the first overlay marker, information relating to the transverse profile of the first overlay marker;
   determining, from the measured property of the alignment marker, information relating to the transverse profile of the alignment marker;
   measuring the position of the alignment marker on the substrate using an alignment system and the determined information relating to the transverse profile of the alignment marker;
   aligning the substrate using the measured position of the alignment marker;
   printing a second overlay marker on the substrate; and
   measuring a lateral overlay on the substrate of the second overlay marker with respect to the first overlay marker using the determined information relating to the transverse profile of the first overlay marker,
   wherein the first overlay marker comprises a first overlay grating having a first pitch and the alignment marker comprises an alignment grating having a second pitch, such that the first pitch and the second pitch are different, and wherein the alignment grating and the first overlay grating deform differently.

2. The method of claim 1, further comprising transferring a pattern from a patterning device onto the substrate after the aligning the substrate using the measured position of the alignment marker.

3. The method of claim 1, wherein the measuring the position of the alignment marker comprises configuring the alignment system to be responsive to the determined information relating to the transverse profile of the alignment marker.

4. The method of claim 1, wherein the measuring the position of the alignment marker comprises configuring the alignment system to be responsive to the determined lateral overlay.

5. The method of claim 1, wherein the property of the first overlay marker and the property of the alignment marker are each dependent on a measure of asymmetry in its respective grating.

6. The device manufacturing method of claim 1, wherein errors in alignment and overlay metrology are different based on the different deformations of the alignment grating and first overlay grating.

7. The method of claim 1, wherein the measured lateral overlay is used in subsequent measurement of the position of the alignment marker on the substrate.

8. The method of claim 1, wherein:
   the determining information relating to the transverse profile of the first overlay marker comprises constructing a model of at least a portion of the first overlay marker; and the determining information relating to the transverse profile of the alignment marker comprises constructing a model of at least a portion of the alignment marker.

9. The method of claim 1, wherein the measuring the lateral overlay comprises:
projecting a second radiation beam onto the first and second overlay markers;
detecting second radiation having interacted with the first and second overlay markers; and
determining the lateral overlay using the detected second radiation.

10. The method of claim 7, wherein the measuring the property of the first overlay marker and the measuring the property of the alignment marker comprises separately:
projecting a radiation beam onto the first overlay marker, detecting radiation from the first overlay marker and determining the property of the first overlay marker using the detected radiation from the first overlay marker; and
projecting a radiation beam onto the alignment marker, detecting radiation from the alignment marker; and determining the property of the alignment marker using the detected radiation from the alignment marker.

11. The method of claim 8, wherein the measuring the lateral overlay comprises constructing a model of a portion of the substrate comprising at least a portion of the first and second overlay markers using the model of the at least a portion of the first overlay marker.

12. The method according claim 9, wherein the projecting the second radiation beam comprises configuring the second radiation beam responsive to the determined information relating to the transverse profile of the first overlay marker and/or configuring the detection of the second radiation beam responsive to the determined information relating to the transverse profile of the first overlay marker.

13. A lithographic apparatus comprising:
an inspection apparatus for measuring lateral overlay on a substrate of a first overlay marker and a second overlay marker, the inspection apparatus comprising:
a first projection system configured to project a radiation beam separately onto the first overlay marker and onto an alignment marker;
wherein the first overlay marker comprises a first overlay grating having a first pitch and the alignment marker comprises an alignment grating having a second pitch;
a first detector configured to detect radiation having interacted with the first overlay marker and to detect radiation having interacted with the alignment marker;
a first processor configured to determine a property of the first overlay marker that depends on a transverse profile of the first overlay' marker, and to determine a property of the alignment marker that depends on a transverse profile of the alignment marker;
a second projection system configured to project a radiation beam onto overlaid first and second overlay markers;
a second detector configured to detect radiation having interacted with overlaid first and second overlay markers;
a second processor configured to determine the lateral overlay using the detected radiation from overlaid first and second overlay markers;
wherein the inspection apparatus is configured to measure a lateral overlay on the substrate of the second overlay marker with respect to the first overlay marker using determined information from the determined property of the first overlay marker relating to the transverse profile of the first overlay marker; and
an alignment system that comprises:
an alignment projection system configured to project an alignment radiation beam onto the alignment marker;
an alignment detector configured to detect alignment radiation having interacted with the alignment marker; and
an alignment processor configured to control alignment of the alignment marker on the substrate, the alignment processor using information from the detected alignment radiation and determined information from the determined property of the alignment marker relating to the transverse profile of the alignment marker, wherein the first pitch and the second pitch are different, and wherein the alignment grating and overlay grating deform differently.

14. The lithographic apparatus of claim 13, wherein the second projection system is configured to be responsive to the determined information relating to the transverse profile of the first overlay marker and/or the second detector is configured to be responsive to the determined. information relating to the transverse profile of the first overlay marker.

15. The lithographic apparatus of claim 13, wherein the first and second processors are comprised as a single processor.

16. The lithographic apparatus of claim 13, wherein the first and second projection systems are comprised as a single projection system, and the first and second detectors are comprised as a single detector.

17. The lithographic apparatus of claim 13, wherein information relating to the transverse profile of the first overlay marker is configured to be determined by constructing a model of at least a portion of the first overlay marker.

18. The lithograpic apparatus of claim 17, wherein a model of a portion of the substrate comprising at least a portion of the first and second overlay markers is configured to be constructed using the model of the at least a portion of the first overlay marker.

19. A non-transitory computer-readable storage device having computer-executable instructions stored thereon, execution of which, by a computing device, causes the computing device to perform operations comprising
measuring on a substrate a property of a first overlay marker that depends on a transverse profile of the first overlay marker;
measuring on the substrate a property of an alignment marker that depends on a transverse profile of the alignment marker;
determining, from the measured property of the first overlay marker, information relating to the transverse profile of the first overlay marker;
determining, from the measured property of the alignment marker, information relating to the transverse profile of the alignment marker;
measuring the position of the alignment marker on the substrate using an alignment system and the determined information relating to the transverse profile of the alignment marker;
aligning the substrate using the measured position of the alignment marker;
printing a second overlay marker on the substrate; and
measuring a lateral overlay on the substrate of the second overlay marker with respect to the first overlay marker using the determined information relating to the transverse profile of the first overlay marker,
wherein the first overlay marker comprises a first overlay grating having a first pitch and the alignment marker comprises an alignment grating having a second pitch, such that the first pitch and the second pitch are different, and wherein the alignment grating and the first overlay grating deform differently.

20. A method of manufacturing a device comprising:

measuring on a substrate a property of a first overlay marker that depends on a transverse profile of the first overlay marker;

measuring on the substrate a property of an alignment marker that depends on a transverse profile of the alignment marker;

determining, from the measured property of the first overlay marker, information relating to the transverse profile of the first overlay marker;

determining, from the measured property of the alignment marker, information relating to the transverse profile of the alignment marker;

measuring the position of the alignment marker on the substrate using an alignment system and the determined information relating to the transverse profile of the alignment marker;

aligning the substrate using the measured position of the alignment marker;

printing a second overlay marker on the substrate using a lithographic apparatus; and measuring a lateral overlay on the substrate of the second overlay marker with respect to the first overlay marker using the determined information relating to the transverse profile of the first overlay marker; and printing product structures on the substrate using the lithographic apparatus, during the printing the second overlay marker on the substrate, wherein the first overlay marker comprises a first overlay grating having a first pitch and the alignment marker comprises an alignment grating having a second pitch, such that the first pitch and the second pitch are Efferent, and wherein the alignment grating and the first overlay grating deform differently.

* * * * *